(12) United States Patent
Horie et al.

(10) Patent No.: US 6,902,101 B2
(45) Date of Patent: Jun. 7, 2005

(54) BUMP BONDING METHOD APPARATUS

(75) Inventors: Satoshi Horie, Kadoma (JP); Takahiro Yonezawa, Neyagawa (JP); Hiroyuki Kiyomura, Takatsuki (JP); Tetsuya Tokunaga, Takatsuki (JP); Tatsuo Sasaoka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/294,614

(22) Filed: Nov. 15, 2002

(65) Prior Publication Data

US 2003/0094481 A1 May 22, 2003

(30) Foreign Application Priority Data

Nov. 16, 2001 (JP) ........................................ 2001-351874

(51) Int. Cl.[7] ........................ B23K 31/00; B23K 31/02; B23K 37/00
(52) U.S. Cl. ........................ 228/180.5; 228/1.1; 228/4.5; 228/180.21; 228/180.22
(58) Field of Search ........................ 228/4.5, 1.1, 180.5, 228/180.22, 110.1, 102; 219/56.21, 56.22; 438/612–614

(56) References Cited

U.S. PATENT DOCUMENTS

| | | | | | |
|---|---|---|---|---|---|
| 4,266,710 A | * | 5/1981 | Bilane et al. | .................. | 228/4.5 |
| 4,438,880 A | * | 3/1984 | Smith et al. | .................. | 228/1.1 |
| 4,598,853 A | * | 7/1986 | Hill | .............. | 228/4.5 |
| 5,011,061 A | * | 4/1991 | Funatsu | ....................... | 228/1.1 |
| 5,060,841 A | * | 10/1991 | Oshima et al. | .............. | 228/102 |
| 5,158,223 A | * | 10/1992 | Shimizu | .................. | 228/180.5 |
| 5,180,094 A | * | 1/1993 | Yanagida et al. | ............. | 228/4.5 |
| 5,244,140 A | * | 9/1993 | Ramsey et al. | .......... | 228/110.1 |
| 5,443,200 A | * | 8/1995 | Arikado | ....................... | 228/102 |
| 5,556,022 A | * | 9/1996 | Orcutt et al. | .................. | 228/1.1 |
| 5,645,210 A | * | 7/1997 | Toner et al. | .................. | 228/102 |
| 5,732,873 A | * | 3/1998 | Topping et al. | ............... | 228/1.1 |
| 5,894,981 A | * | 4/1999 | Kelly | .......................... | 228/104 |
| 5,931,372 A | * | 8/1999 | Miller | ....................... | 228/180.5 |
| 5,984,162 A | * | 11/1999 | Hortaleza et al. | ......... | 228/110.1 |
| 6,017,812 A | * | 1/2000 | Yonezawa et al. | ........... | 438/613 |
| 6,102,275 A | * | 8/2000 | Hill et al. | .................. | 228/180.5 |
| 6,164,514 A | * | 12/2000 | Miller | ........................ | 228/1.1 |
| 6,360,600 B1 | * | 3/2002 | Kuroki et al. | ............ | 73/504.12 |
| 6,474,538 B1 | * | 11/2002 | Yonezawa et al. | ........... | 228/262 |
| 6,500,760 B1 | * | 12/2002 | Peterson et al. | ............. | 438/684 |
| 6,676,005 B2 | * | 1/2004 | Itoh et al. | ....................... | 228/19 |
| 2003/0006271 A1 | * | 1/2003 | Chen et al. | ............... | 228/180.5 |

FOREIGN PATENT DOCUMENTS

JP         10-261645         9/1998

OTHER PUBLICATIONS

English Language Abstract of JP 10–261645.

* cited by examiner

Primary Examiner—Lynne R. Edmondson
(74) Attorney, Agent, or Firm—Greenblum & Bernstein, P.L.C.

(57) ABSTRACT

In a bump bonding technique for forming a bump on an IC, including forming a ball at the tip of a gold wire protruding from a capillary, and providing a metal-to-metal joint by applying ultrasonic vibration from a ultrasonic head through the capillary while pressing the ball against a pad portion on the IC, the metal-to-metal joint is provided by applying the ultrasonic vibration at a frequency in a range of 130 to 320 kHz, more preferably in a range of 170 to 270 kHz, and most preferably at a frequency of 230±10 kHz at room temperatures and atmospheric pressure. Consequently, a bump is formed on an IC having a low heat resistance temperature in a satisfactory joint condition, and a bump is formed with good positional accuracy without giving the influence of heat to the surroundings.

16 Claims, 9 Drawing Sheets

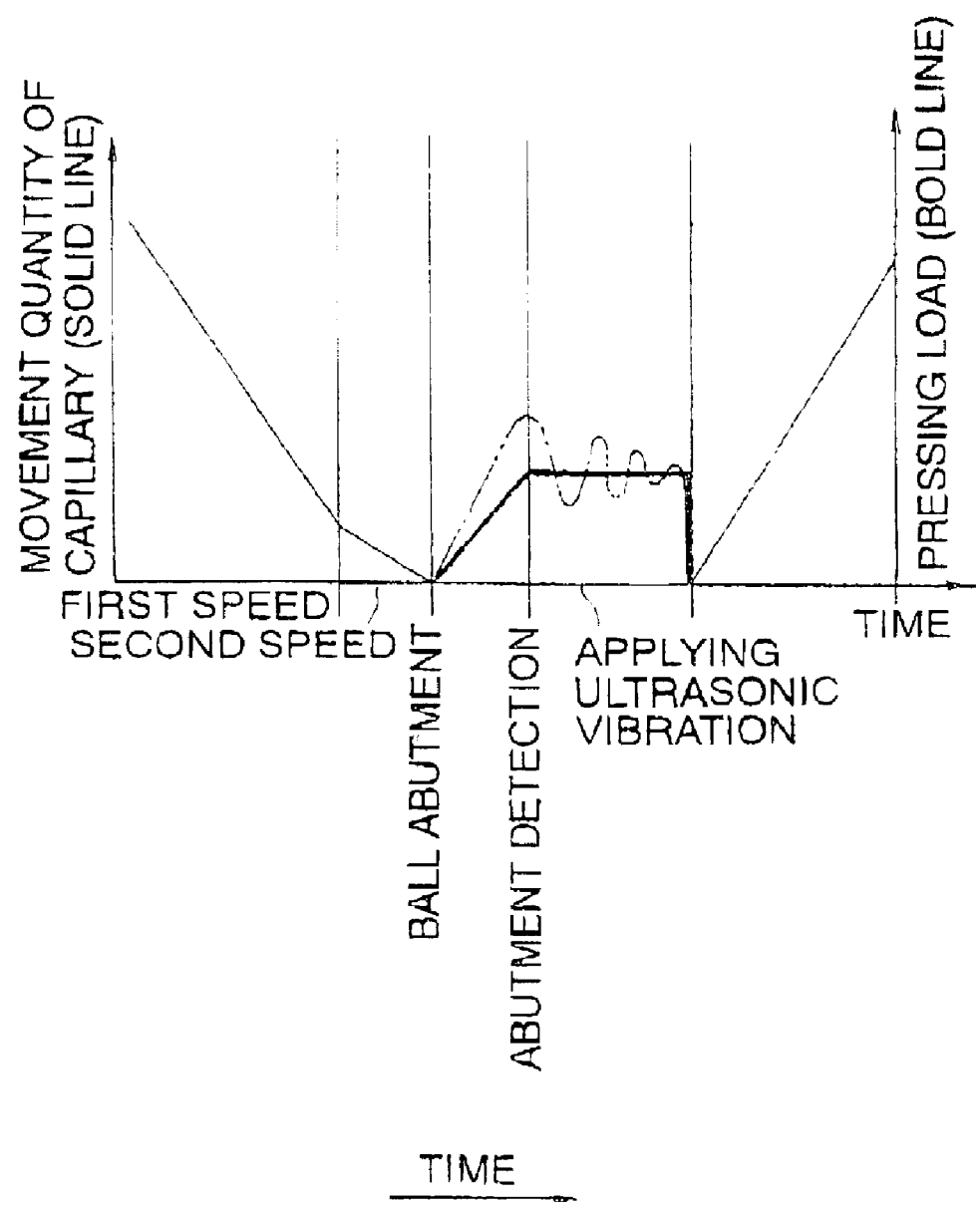

Fig. 3A  Fig. 3B  Fig. 3C
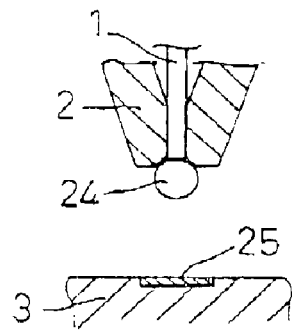 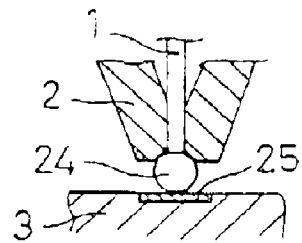 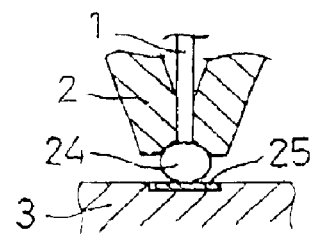
Fig. 3D  Fig. 3E
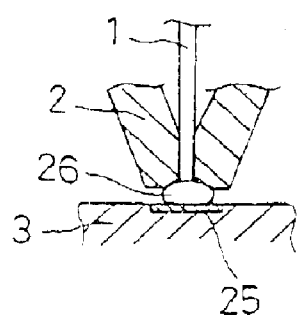 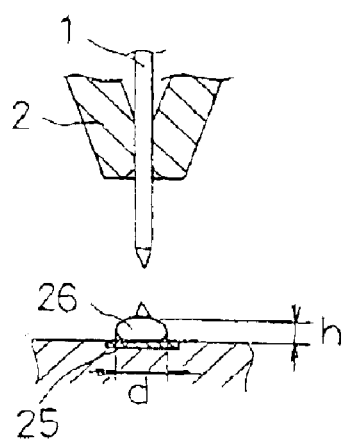

BUMP BONDING METHOD APPARATUS

The present disclosure relates to subject matter contained in priority Japanese Patent Application No. 2001-351874, filed on Nov. 16, 2001, the contents of which is herein expressly incorporated by reference in its entirety.

BACKGROUND OF THE INVENTION

1. Field of the Invention

The present invention relates to a bump bonding method and apparatus used when fabricating a flip-chip semiconductor integrated circuit (hereinafter, referred to as an IC), for forming a protruding electrode (hereinafter, referred to as a stud bump or simply as a bump) on the IC.

2. Description of Related Art

Conventionally, a bump bonding technique is known which applies the wire bonding technique to form a bump. The bump is formed by the ultrasonic joining of a ball, made of gold or gold-plated metal, to an electrode pad (hereinafter, referred to simply as a pad) on the flip-chip IC.

FIG. 7A and FIG. 7B show a typical embodiment of a conventional bump bonding apparatus. Referring to FIG. 7A and FIG. 7B, reference numeral 31 denotes a gold wire, reference numeral 32 denotes a capillary through which the gold wire 31 penetrates, reference numeral 33 denotes an IC, reference numeral 34 denotes a discharge torch provided in close proximity to the tip of the gold wire 31, reference numeral 35 denotes a ultrasonic horn having the capillary 32 attached at the tip portion thereof, and reference numeral 36 denotes a ultrasonic transducer attached to the base portion of the ultrasonic horn 35. Reference numeral 37 denotes a bonding arm whose middle portion is pivotably supported by a supporting bracket 38 through a pivotal supporting axis 37a. The bonding arm 37 is provided with the ultrasonic horn 35 and the ultrasonic transducer 36 at one end, and with vertical driving means 39 at the other end. Reference numeral 40 denotes an X-Y table on which is placed the supporting bracket 38. Reference numeral 41 denotes a damper for holding the gold wire 31, and reference numeral 42 denotes an air tensioner for lifting the gold wire 31. Reference numeral 43 denotes a heat stage for heating the IC 33. The heat stage 43 also has a function for positioning and holding the IC 33. Reference numeral 44 denotes a heater of the heat stage 43. Reference numeral 45 denotes a recognition camera for recognizing the position of the IC 33. Reference numeral 46 denotes an ultrasonic oscillator, reference numeral 47 denotes a spark generator, and reference numeral 48 denotes a high voltage cable.

The operation of the conventional bump bonding apparatus will now be explained. Initially, the IC 33 is held and heated at the heat stage 43. Meanwhile, the recognition camera 45 recognizes the IC 33, and then the relative position of the IC 33 with respect to the capillary 32 is determined through the use of the X-Y table 40. The spark generator 47 is activated to generate a spark between the tip of the gold wire 31 (protruding from the capillary 32) and the discharge torch 34, to form a gold ball 49 as shown in FIG. 8A. The vertical driving means 39 then drives the bonding arm 37 so as to lower the capillary 32. After an abutment detecting function furnished to the vertical driving means 39 detects a pad portion 50 on the IC 33, the ultrasonic oscillator 46 starts to drive the ultrasonic transducer 36 while a specific applied pressure is maintained on the gold ball 49. This oscillates ultrasonic waves at a frequency in the range of 64 to 110 kHz, through the ultrasonic horn 35, to the capillary 32. Then, as shown in FIG. 8B, the gold ball 49 is joined to the pad portion 50 on the IC 33, thereby forming a bump 51. Subsequently, after the capillary 32 is elevated by a certain distance, the gold wire 31 is elevated while being held by the damper 41, thereby causing the joint portion between the bump 51 and the gold wire 31 to break. The bump 51, formed as a protruding electrode is thus completed over the pad portion 50 on the IC 33.

When a bump is formed as described above, the heating temperature of the heat stage 43 by the heater 44 is determined depending on the size of the bump 51 to be formed, and the kind of the IC 33 to be used. To be more specific, the temperature is set to 260° C. when the diameter of a bump pedestal 51a (see FIG. 8B) is 80 μm, and to around 300° C. when it is 50 μm. This is because the microscopic joint area is reduced when the bump pedestal 51a becomes smaller. As the energy generated from the ultrasonic waves and load cannot be applied to such a small bump pedestal at such a high level, it makes it necessary to apply more energy from the outside.

Also, in the case of an IC incorporated in a SAW filter or a sensor having poor resistance to heat, the temperature cannot be raised as high as specified above. Consequently, heat is supplied only up to a level less than the upper temperature which the IC is resistant.

In recent years, however, the distance between adjacent electrode pad portions on the IC has been reduced, and so is the size of the bump pedestal 51a. This makes it necessary to raise the heating temperature of the IC 33. Raising the heating temperature, however, poses three major problems as follows:

A first problem is that because the heating temperature cannot be raised for an IC having poor resistance to heat, it is difficult to form a bump having high reliability on such an IC.

A second problem is that heat from the heater 44 adversely effects the bonding mechanism portion. Heat propagated from the heater 44 to the heat stage 43 is released and is eventually transferred to the bonding mechanism portion, which gives rise to thermal expansion of the horn 35, the lens-barrel portion of the recognition camera 45, and the bonding arm 37. As a consequence, bonding is provided at a position offset from the position judged by the recognition camera 45, resulting in the bump 51 extending out from the pad portion 50. When the distance present between the adjacent pad potions 50 is small, the bump 51 can touch an adjacent bump 51, causing a connection defect to occur when joined to the substrate in a latter step of the sequence.

A third problem is the influence upon the bonding process on a wafer. In order to make the IC thinner and reduce the step numbers involved in the dice and pick process, the process of forming bumps on a wafer before it is cut into ICs has become mainstream in recent years in contrast to the process of forming bumps on individual ICs. According to this method, however, when the wafer is heated by the heater 44, applied heat is maintained in the ICs after the bumps are formed thereon. As a result, more metal is diffused between the gold balls and the pad portions made of aluminum. This causes cracking or voids on the joint interface, which again results in a joint defect. Also, in the case of a wafer attached to a sheet, the heating temperature of the heater 44 is limited to, or below, the temperature to which the sheet is resistant. This makes it difficult to maintain the joint quality.

SUMMARY OF THE INVENTION

The present invention is devised in light of the foregoing conventional problems, and has an object to provide a bump bonding method and apparatus capable of joining a ball to a pad portion on an IC with high reliability without the need of heating from the outside, for example, using a heater, and also capable of forming a bump in a satisfactory joint condition.

A bump bonding method of the invention is a bump bonding method of forming a bump on an IC, including forming a ball at a tip of a wire and providing a metal-to-metal joint by applying ultrasonic vibration while pressing the ball against a pad portion on the IC, and the metal-to-metal joint is provided by applying the ultrasonic vibration at a frequency in the range of 130 to 320 kHz at room temperatures and atmospheric pressure. By exciting the ball at a frequency higher than the conventionally used frequency in the range of 64 to 110 kHz, a quantity of exposure of the newly generated interface of the ball is increased and the friction heat is raised. This allows high joining energy to be applied to the joint portion without heating from the outside. Thus, a bump is formed on an IC having a low heat resistance in a satisfactory joint condition. Also, a bump is formed with good positional accuracy without giving the influence of heat to the surroundings, thereby making it possible to form a bump having high reliability on an IC of a microscopic size.

The frequency of the ultrasonic vibration to be applied is preferably in a range of 170 to 270 kHz, and most preferably at 230±10 kHz. In principle, the higher the frequency, the greater the advantage becomes. However, the reproducibility of the oscillation deteriorates at a frequency of 320 kHz or higher, which makes it difficult to achieve an operating condition stable enough to be applied to practical industrial use. Thus, the optimal frequency is set to 230±10 kHz at which the stable operating condition is achieved from inexpensive materials and structure.

When the pad portion on the IC and the bump are made of different materials, in particular, as are with today's most popular cases, when the pad portion is made of aluminum and the bump is made of gold, higher joining energy is required than in the case of joining the same material, and the invention thereby provides an outstanding advantage.

Also, it is arranged as follows: after the ball is formed at the tip of the wire, the ball is moved at a first speed just before the ball abuts the pad portion; the ball is then moved at a second speed slower than the first speed until the ball abuts the pad portion; after the ball abuts the pad portion, a pressing pressure of the ball is increased linearly or almost linearly until the pressure reaches a certain pressing pressure; and when the pressing pressure reaches the certain pressing pressure, the ultrasonic vibration is applied while the applied pressing pressure is maintained. According to this arrangement, by allowing the ball to move at a high speed just before it abuts the pad portion, the productivity is maintained. Also, by allowing the ball to move at a slow speed later, the impact is lessened when the ball abuts the pad portion; moreover, the pressing pressure is increased linearly after the abutment. Hence, it is possible to prevent the occurrence of an unwanted event such that the ball undergoes noticeable compression deformation due to the impact when the ball abuts the pad portion, and the shape of the ball is changed as high frequency ultrasonic vibration is applied while the ball being deformed, thereby making it impossible to form a bump in an appropriate shape.

A bump bonding apparatus of the present invention is a bump bonding apparatus including; a bonding stage, having no internal heating means, for positioning an IC; and a ultrasonic head for applying ultrasonic vibration at a frequency in the range of 130 to 320 kHz while a ball formed at a tip of a wire is kept pressed against a pad portion on the IC. The bump bonding apparatus provides an advantage by implementing the foregoing bump bonding method.

It is preferable that the ultrasonic head includes a capillary from which the wire is protruding, and an ultrasonic horn having the capillary attached at a tip portion thereof, and an ultrasonic transducer attached at a base portion of the ultrasonic horn. It is also preferable that the bump boning apparatus further includes: a bonding arm for supporting the ultrasonic head to allow elastic displacement to be caused while allowing the capillary forming the ultrasonic head to move toward the IC on the bonding stage; and a displacement detecting device for detecting a quantity of elastic displacement caused between the bonding arm and the ultrasonic head. Since the ultrasonic head is elastically supported while being separated from the bonding arm, the force of inertia to be applied to the capillary is lessened, and the impact force when the ball formed at the tip of the capillary abuts the pad portion on the IC is suppressed. After the abutment, the pressing pressure of the ultrasonic head increases almost linearly in response to a quantity of elastic displacement associated with the movement of the bonding arm, and the pressing pressure can also be detected on the basis of a quantity of displacement. Hence, ultrasonic joining is performed under the condition that the pressing pressure is controlled accurately. Further, since the ultrasonic head is supported elastically while being separated and has small force of inertia, the moving speed of the ball just before the abutment on the pad portion can be markedly high in comparison with the conventional moving speed, thereby improving the productivity.

Also, by designing the ultrasonic transducer to resonate at a frequency in the range of 130 to 320 kHz, and the ultrasonic horn to have a horn length as long as one wavelength of a ultrasonic vibration wavelength, not only the horn length of the ultrasonic horn is short, but also high oscillation reproducibility is achieved.

While novel features of the invention are set forth in the preceding, the invention, both as to organization and content, can be further understood and appreciated, along with other objects and features thereof, from the following detailed description and examples when taken in conjunction with the attached drawings.

BRIEF DESCRIPTION OF THE DRAWINGS

FIG. 2 is a view showing a quantity of movement of a capillary and a change in pressing load after the abutment of a ball during a bump bonding operation of the embodiment;

FIG. 3A through FIG. 3E are explanatory views of the bump bonding operation of the embodiment;

DETAILED DESCRIPTION OF THE PREFERRED EMBODIMENTS

The following will describe one embodiment of a bump bonding apparatus of the invention with reference to FIG. 1 through FIG. 5.

Figure 1:
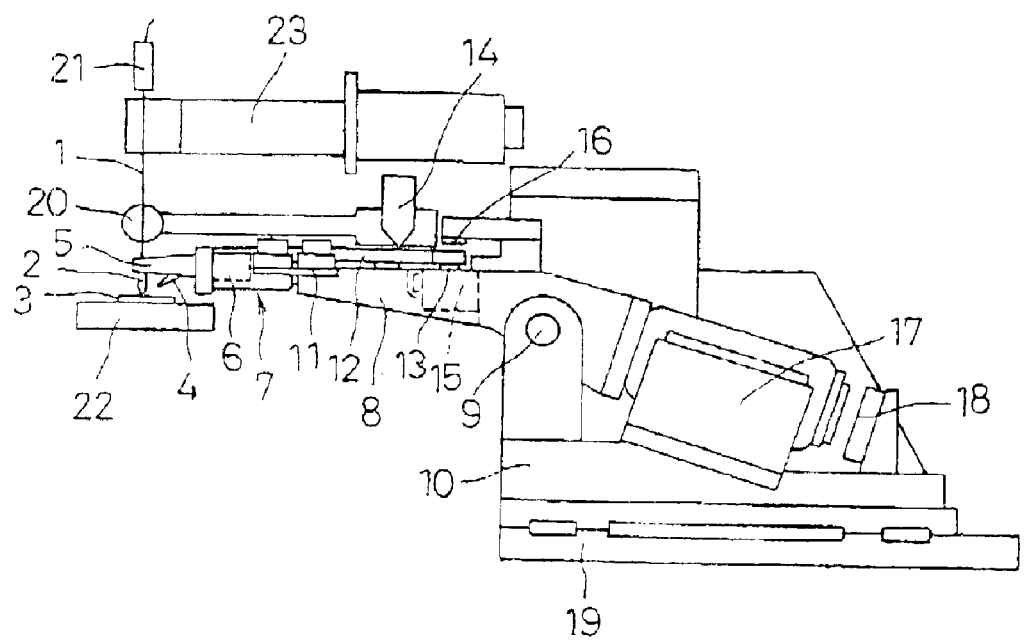
FIG. 1 is a side view schematically showing an arrangement of a bump bonding apparatus according to one embodiment of the invention.

Referring to FIG. 1, reference numeral 1 denotes a gold wire from which a ball is made, reference numeral 2 denotes a capillary through which the gold wire 1 penetrates, reference numeral 3 denotes an IC, reference numeral 4 denotes a discharge torch provided in close proximity to the tip of the gold wire 1, reference numeral 5 denotes a ultrasonic horn having the capillary 2 attached at the tip portion thereof, and reference numeral 6 denotes a ultrasonic transducer attached to the base portion of the ultrasonic horn 5. The capillary 2, the ultrasonic horn 5, and the ultrasonic transducer 6 together form an ultrasonic head 7. The ultrasonic transducer 6 is designed to have the resonant frequency of 230 kHz, and the ultrasonic horn 5 is designed to have a horn length as long as one wavelength of the ultrasonic vibration wavelength to reduce both the weight and the size. Also, a holder for holding the ultrasonic horn 5 is formed integrally in the form of a flange. This arrangement eliminates the loss of ultrasonic waves due to the difference in holding power and supporting point, and ultrasonic energy is thus transferred or supplied in a stable manner even at a frequency as high as 230 kHz.

Reference numeral 8 denotes a bonding arm whose middle portion is pivotably supported by a supporting bracket 10 through a pivotal supporting axis 9. The ultrasonic head 7 is attached at one end thereof through a blade spring 11 to allow displacement to be caused. In regard to the ultrasonic head 7, the capillary 2 is supported so that it is allowed to move vertically, using the blade spring 11 as a hinge, and a function arm 12 protrudes from the ultrasonic head 7 so as to extend above one end of the bonding arm 8 over the blade spring 11. Provided between the function arm 12 and the one end of the bonding arm 8 are a compression spring 13, a stopper 14, a pressing pressure adjusting member 15, and a gap sensor 16. The compression spring 13 energizes the capillary 2 to move downward. The stopper 14 limits the movement end. The pressing pressure adjusting member 15 adjusts a quantity of compression when the compression spring 13 is set. The gap sensor 16 detects a quantity of displacement of the function arm 12 from the position limited by the stopper 14.

A vertical driving device 17 for driving the bonding arm 8 is provided at the other end of the bonding arm 8 together with a position sensor 18 for detecting the moved position of the bonding arm 8. Reference numeral 19 denotes an X-Y table on which is placed the supporting bracket 10. Reference numeral 20 denotes a clamper for holding the gold wire 1, and reference numeral 21 denotes an air tensioner for lifting the gold wire 1. Reference numeral 22 denotes a bonding stage for holding the IC 3 for positioning, and reference numeral 23 denotes a recognition camera for recognizing the position of the IC 3.

The operation of the bump bonding apparatus of the embodiment will now be explained. Initially, the IC 3 is held by the bonding stage 22. Meanwhile, the recognition camera 23 recognizes the IC 3, and the relative position of the IC 3 with respect to the capillary 2 is determined through the use of the X-Y table 19. A spark is generated between the tip of the gold wire 1 (protruding from the capillary 2) and the discharge torch 4, to form a gold ball 24 as shown in FIG. 3A. The vertical driving device 17 then drives the bonding arm 8 so as to lower the capillary 2 while detecting the position of the capillary 2 by the position sensor 18. In this instance, as shown in FIG. 2, the capillary 2 is moved at a fast first speed just before the gold ball 24 abuts a pad portion 25 on the IC 3 and the first speed is switched to a slow second speed at the position just before the abutment.

Next, as shown in FIG. 3B, when the gold ball 24 abuts the pad portion 25, the capillary 2 is stopped basically except for compression deformation that the gold ball 24 undergoes. When the gold ball 24 abuts the pad portion 25, because the ultrasonic head 7 is separated from the bonding arm 8, the secondary moment of inertia at a portion having the capillary 2 is reduced to approximately one-fiftieth (1/50) of that in the conventional bump bonding apparatus having the ultrasonic head 7 and the bonding arm 8 formed as an integral unit. Moreover, the moving speed is switched to the slow second speed just before the abutment. Hence, as shown in FIG. 2, the magnitude of the impact load and a quantity of varied load are lessened to an extremely low level in comparison with those of the conventional bump bonding apparatus indicated by an imaginary line. As shown in FIG. 3B, even when the gold ball 24 is of a microscopic size, the gold ball 24 is prevented from undergoing noticeable deformation. Further, even when the second speed is set to, for example, approximately 10 mm/sec., the magnitude of the impact load falls within the allowable range on the contrary to the conventional case where the speed needs to be set as slow as 2 mm/sec. Hence, the moving speed is increased five-fold, and the productivity is thus improved markedly.

The bonding arm 8 keeps moving after the gold ball 24 has abutted the pad portion 25, and the blade spring 11 undergoes deformation in response to a quantity of movement, which gives rise to relative displacement between one end of the bonding arm 8 and the ultrasonic head 7. Then, the compression spring 13 is compressed in response to the quantity of displacement, and the resulting reaction force presses the gold ball 24 against the pad portion 25 through the capillary 2. As shown in FIG. 2, the pressing load increases almost linearly in response to the quantity of relative displacement between the one end of the bonding arm 8 and the ultrasonic head 7. The gap sensor 16 detects the quantity of relative displacement between the one end of the bonding arm 8 and the ultrasonic head 7, and when the quantity of relative displacement reaches a predetermined value, it judges that the pressing load has reached a predetermined value, whereupon the movement of the ultrasonic head 7 using the vertical driving device 17 is stopped. In this manner, the pressing pressure of the gold ball 24 is controlled accurately, and under such a condition, as shown in FIG. 3C, the gold ball 24 is limited to be in the optimal pressed and deformed condition to transfer high frequency ultrasonic vibration energy.

Under this pressed condition, the ultrasonic transducer 6 is driven and ultrasonic vibration at a frequency as high as 230 kHz is applied to a portion between the gold ball 24 and the pad portion 25 through the ultrasonic horn 5 and the capillary 2. As a result, the gold ball 24 and the pad portion 25 are joined to each other at the low load and low amplitude, to form a bump 26 as shown in FIG. 3D. When providing this joint, by applying ultrasonic vibration at high frequency, low load, and low amplitude, a quantity of deformation per unit time of the gold ball 24 is decreased, whereas the number of frictions per unit time is increased. Accordingly, an exposed area is increased within a new interface generated when the gold ball 24 undergoes deformation, and the temperature of friction heat is raised at the same time. This enables forming the bump 26 without the need of heating from the bonding stage 22.

Subsequently, after the capillary 2 is elevated by a certain distance, the gold wire 1 is also elevated while being held by the clamper 20. Then, as shown in FIG. 3E, the joint portion between the bump 26 and the gold wire 1 is broken, and the bump 26 formed as a protruding electrode is thus completed over the pad portion 25 on the IC 3.

Figure 4:
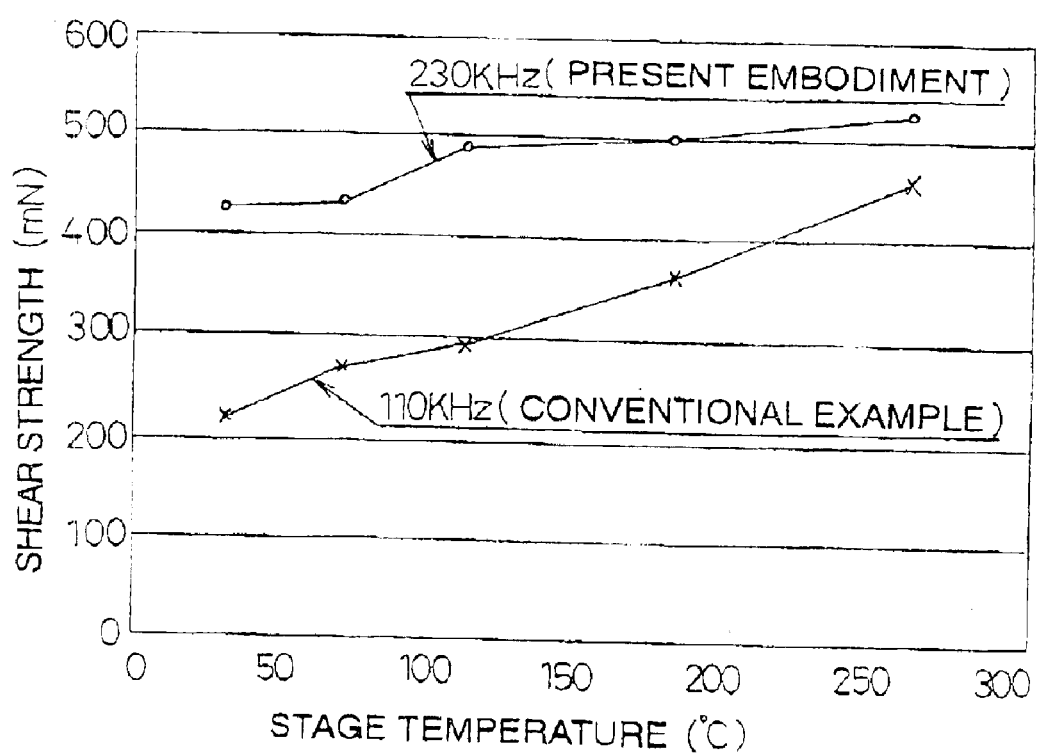
FIG. 4 is a graph of the shear strength versus the stage temperature of bumps formed in accordance with the method of the embodiment and the conventional method.
Figure 5:
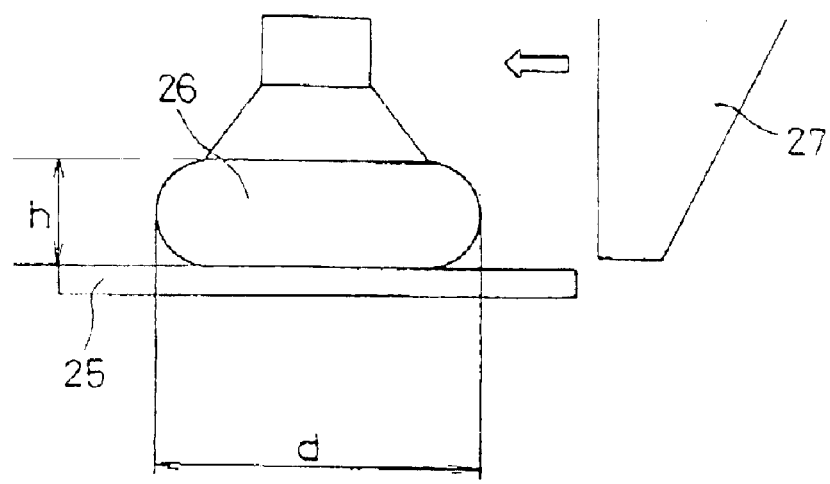
FIG. 5 is an explanatory view of a measuring method of the shear strength.

To be more specific, as shown in FIG. 5, the bump 26 having the pedestal diameter d of 80 $\mu$m and the pedestal height h of 20 $\mu$m is formed over the pad portion 25 (made of aluminum) on the IC 3 at a pitch of 120 $\mu$m, using the gold wire 1 having the diameter of 25 $\mu$m in accordance with the embodiment above. The quality of the bump 26 is evaluated through shear strength measurement, the result of which is set forth in FIG. 4. The shear strength measurement is a mean to measure the load needed to remove the bump 26 by a pick 27, which is placed so that its tip is leveled with the joint surface between the bump 26 and the pad portion 25 as shown in FIG. 5. Hence, the higher the shear strength, the higher the reliability of the joint becomes.

In FIG. 4, the stage temperature is used as the abscissa and the shear strength as the ordinate, and the shear strength is a plot of an average value under each condition. The room temperatures condition without heating is indicated at a point where the stage temperature is 30° C. The graph reveals that, according to the present embodiment, the shear strength exceeds 392 mN, which is deemed as a value that ensures the reliability, even at room temperatures. FIG. 4 also shows the result of a comparative example, which is obtained by replacing the ultrasonic horn 5 with the one that resonates at a frequency of 110 kHz and thereby applying ultrasonic waves at 110 kHz as the load. The comparative example has the shear strength far lower than that obtained at the frequency of 230 kHz, and when the joint is provided at the room temperatures, a joint defect that the bump fails to join to the pad portion occurs at a ratio of one out of several bumps.

Figure 9:
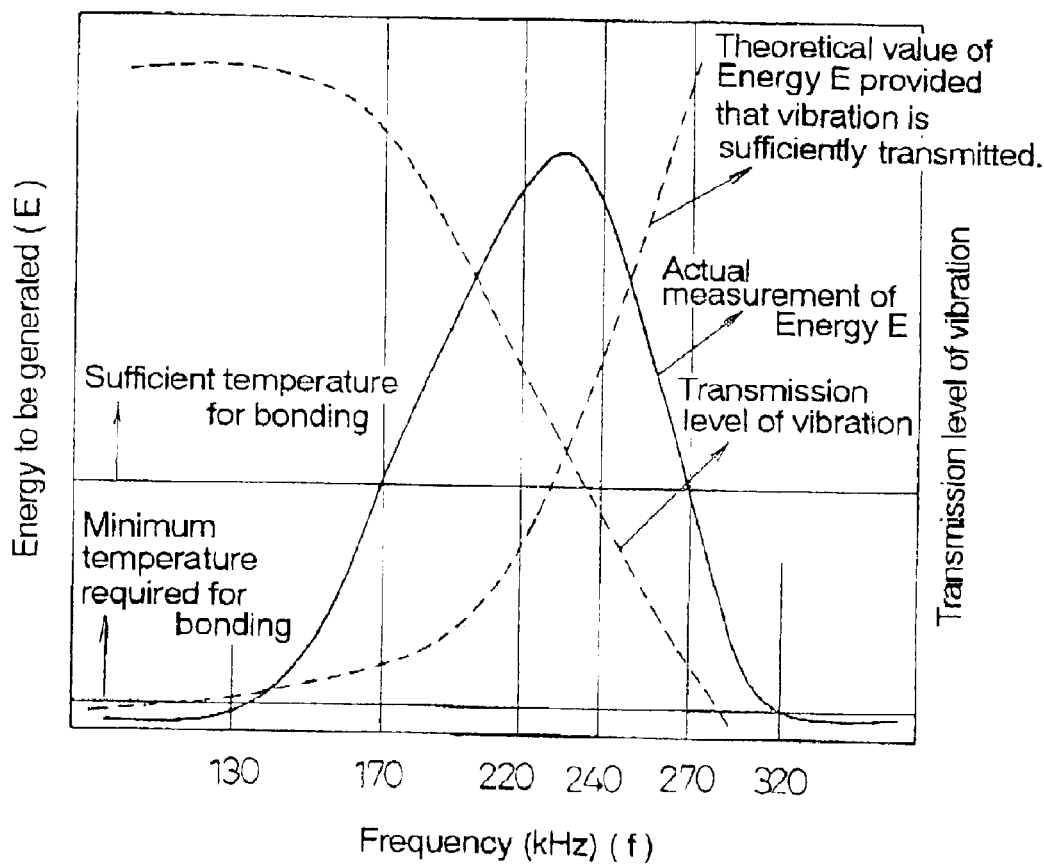
FIG. 9 is a graph showing a relationship between a frequency of ultrasonic waves, and energy to be generated and transmission level of vibration.

It is known that a relationship between a frequency f of ultrasonic waves, energy E to be generated, and temperature T is given by the equation $E=A \times f^2 \times T$, where A is a coefficient (refer to FIG. 9). Consequently, in a case where the frequency is low, namely 130 kHz or below, generated energy is low. This leads to an insufficient temperature of a portion to be bonded, resulting in a failure of bonding. On the other hand, in a case where the frequency is high, namely 320 kHz or above, since the width of vibration is small, vibration of the ultrasonic transducer 6 cannot be transmitted to the tip of the capillary 2, failing to obtain a sufficient temperature for bonding.

The embodiment above described a case where the bump 26 is formed by placing an individual IC 3 on the bonding stage 22. However, because the bump can be joined at room temperatures according to the invention, bumps can be formed on a wafer before it is cut into ICs in the case that the ICs have poor heat resistance. Accordingly, not only is the bump formed on a thin IC, but also the cost is saved by omitting the dice and pick process that demands separate equipment. Moreover, it is possible, to prevent the occurrence of a joint defect due to the heat kept applied to the IC from the outside after the bump is formed.

Figure 6:
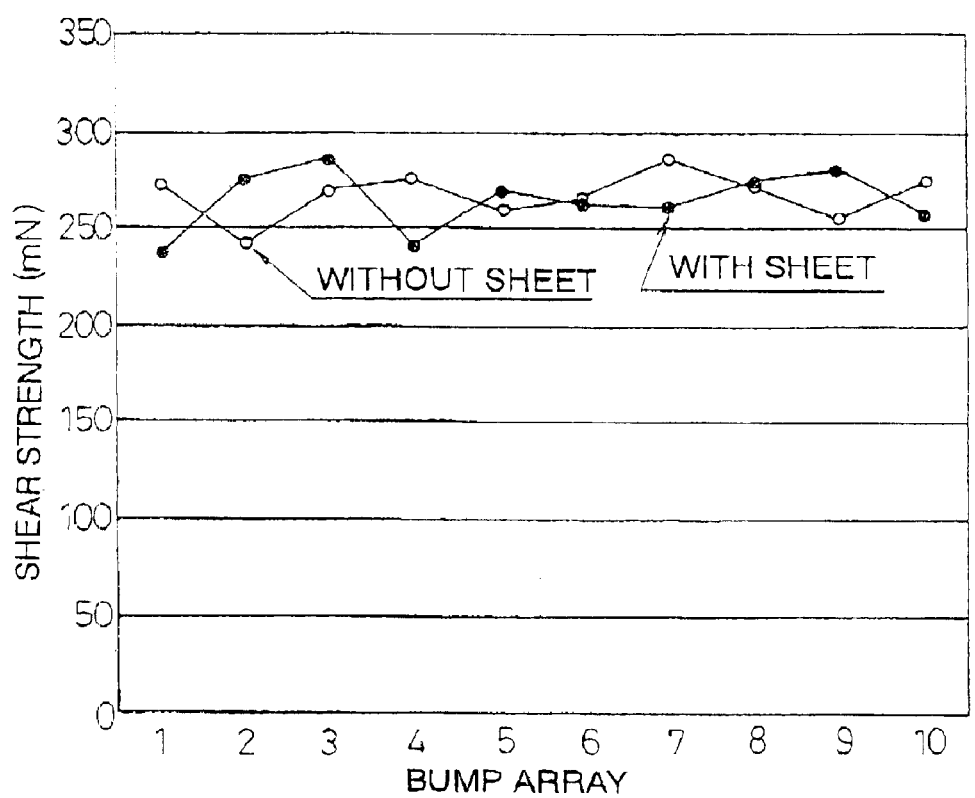
FIG. 6 is a graph showing the shear strength when a bump is formed on an IC attached to an expanded sheet in the embodiment.
Figures 7A, 7B:
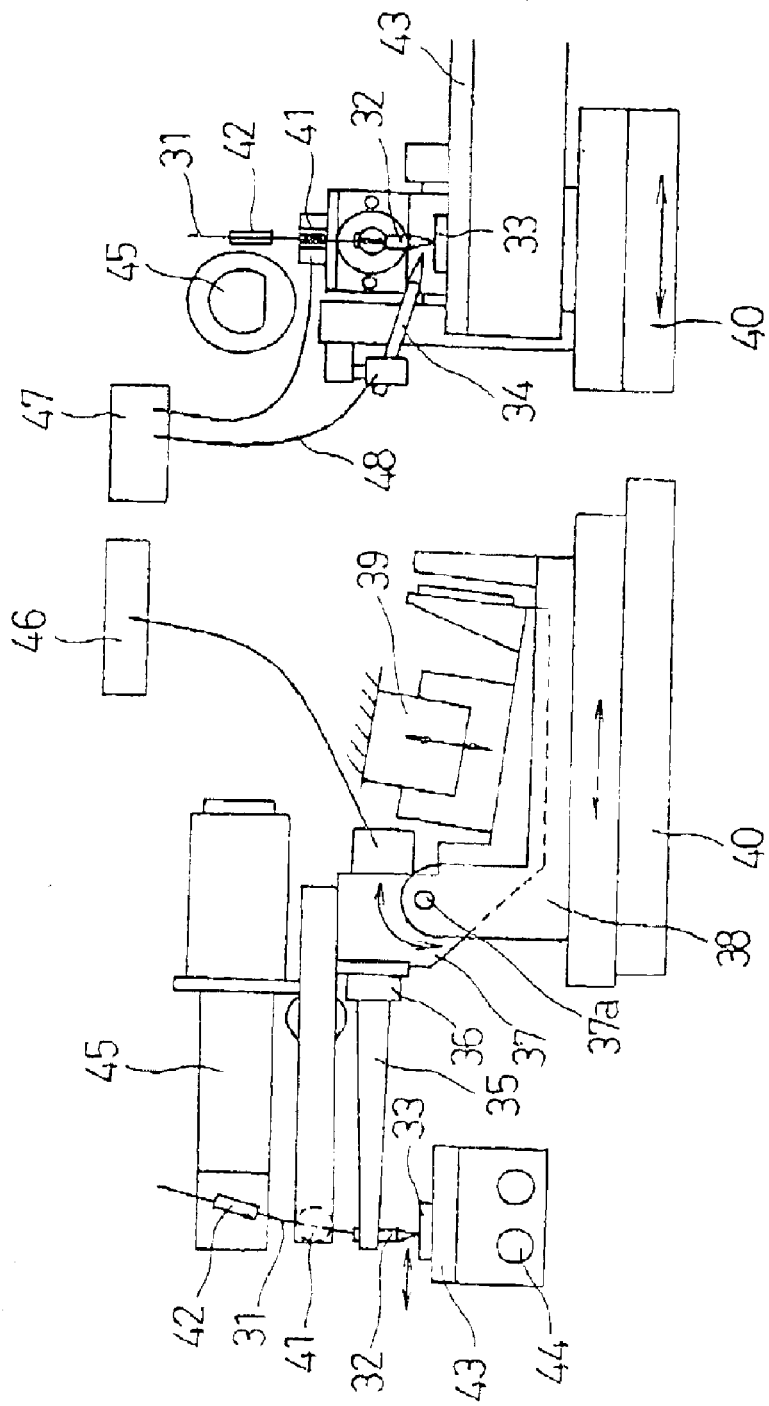
FIG. 7A is a side view and FIG. 7B is a front view both schematically showing an arrangement of a conventional bump bonding apparatus.
Figure 8A:
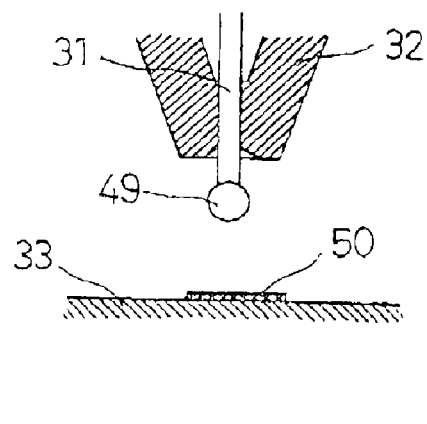
FIG. 8A and FIG. 8B are explanatory views of a bump forming operation of the conventional apparatus.
Figure 8B:
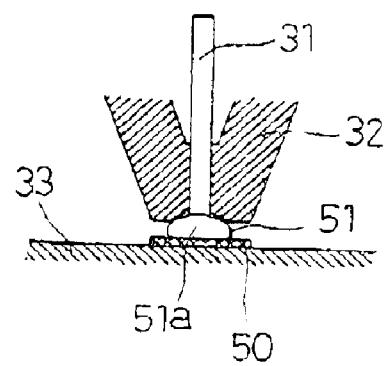

Also, bumps can be formed on the respective ICs diced from a wafer and attached to an expanded sheet having the heat resistance temperature lower than 80° C. Hence, not only are bumps formed on thin ICs, but also the cost is saved by omitting the dice and pick process that involves many steps. Moreover, because heat is not applied exceedingly to the expanded sheet having poor heat resistance, a bump having high reliability is formed. FIG. 6 shows a measurement result of the shear strength when bumps are formed on the ICs attached to the sheet. It is revealed that the strength is more or less the same regardless of the presence or absence of the sheet.

According to the bump bonding method and apparatus of the invention, a quantity of exposure of the newly generated interface of the ball is increased and the friction heat with the pad portion is raised, which allows high bonding energy to be applied to the joint portion without the need of heating from the outside. Hence, a bump is formed on an IC having a low heat resistant temperature in a satisfactory joint condition. Also, a bump is formed with good positional accuracy without giving influence of heat to the surroundings, thereby making it possible to form a bump having high reliability on an IC of a microscopic size.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A bump bonding method for forming a bump on an IC, comprising:
   forming a ball at a tip of a wire by melting the wire;
   moving the ball at a first speed before the ball abuts a pad portion on the IC, and then moving the ball at a second speed, slower than the first speed, until the ball abuts the pad portion;
   substantially linearly increasing, after the ball abuts the pad portion, a pressing pressure of the ball until the pressing pressure reaches a predetermined value; and
   forming a metal-to-metal joint by applying ultrasonic vibration while pressing the ball against the pad portion on the IC, and wherein the ultrasonic vibration is applied while the applied pressing pressure is maintained, when the pressing pressure reaches the predetermined value,
   wherein the ultrasonic vibration has a frequency in a range of 130 to 320 kHz.

2. The bump bonding method according to claim 1, wherein the frequency of the ultrasonic vibration is in a range of 170 to 270 kHz.

3. The bump bonding method according to claim 1, wherein the pad portion on the IC and the bump comprise different materials.

4. The bump bonding method according to claim 3, wherein the pad portion is aluminum and the bump is gold.

5. The bump bonding method according to claim 1, wherein a plurality of the ICs are formed on a wafer, and bumps are formed on the respective ICs on the wafer before being cut into the individual ICs.

6. The bump bonding method according to claim 1, wherein the bump is formed on the IC diced from a wafer and attached to an expanded sheet.

7. A bump bonding apparatus, comprising:
   a bonding stage that supports an IC;
   an ultrasonic head that applies ultrasonic vibration, the ultrasonic head including a capillary from which a wire to be formed into a ball protrudes, an ultrasonic horn having the capillary attached at a tip portion of the ultrasonic horn, and an ultrasonic transducer attached at a base portion of the ultrasonic horn;

a bonding arm that supports the ultrasonic head to allow elastic displacement of the ultrasonic head with respect to the bonding arm while allowing the capillary of the ultrasonic head to move toward the IC on the bonding stage;

a blade spring that attaches the ultrasonic head to the bonding arm; and a displacement detector that detects an amount of elastic displacement between the bonding arm and the ultrasonic head.

8. A bump bonding apparatus, comprising:

a bonding stage that supports an IC;

an ultrasonic head that applies ultrasonic vibration, the ultrasonic head including a capillary from which a wire to be formed into a ball protrudes, an ultrasonic horn having the capillary attached at a tip portion of the ultrasonic horn, and an ultrasonic transducer attached at a base portion of the ultrasonic horn;

a bonding arm that supports the ultrasonic head to allow elastic displacement of the ultrasonic head with respect to the bonding arm while allowing the capillary of the ultrasonic head to move toward the IC on the bonding stage; and a displacement detector that detects an amount of elastic displacement between the bonding arm and the ultrasonic head, wherein the ultrasonic transducer resonates at a frequency in a range of 130 to 320 kHz, and the ultrasonic horn has a horn length as long as one wavelength of a ultrasonic vibration wavelength.

9. The bump bonding method according to claim 1, wherein the frequency of the ultrasonic vibration is 230±10 kHz.

10. The bump bonding apparatus according to claim 7, further comprising:

a pressure adjuster that adjusts an amount of compression of a compression spring that energizes the capillary.

11. The bump bonding apparatus according to claim 7, further comprising:

a drive device that drives the bonding arm.

12. The bump bonding apparatus according to claim 7, further comprising:

a drive device that drives the bonding arm; and a pressure adjuster that adjusts an amount of compression of a compression spring that energizes the capillary.

13. A bump bonding method for forming a bump on an IC, comprising:

forming a ball at a tip of a wire by melting the wire;

attaching, with a blade spring, a bonding arm to an ultrasonic head that holds the ball;

moving the bonding arm and the ultrasonic head until the ball contacts the IC and then further moving the bonding arm;

forming a metal-to-metal joint by applying ultrasonic vibration while pressing the ball against a pad portion on the IC, wherein the ultrasonic vibration has a frequency in a range of 130 to 320 kHz.

14. A bump bonding method for forming a bump on an IC, comprising:

forming a ball at a tip of a wire by melting the wire;

moving a bonding arm and an ultrasonic head that holds the ball until the ball contacts the IC and then further moving the bonding arm;

forming a metal-to-metal joint by applying ultrasonic vibration having a frequency in a range of 130 to 320 kHz, while pressing the ball against a pad portion on the IC, moving the ball at a first speed before the ball abuts the pad portion, and moving the ball at a second speed, slower than the first speed, until the ball abuts the pad portion;

increasing a pressing pressure, after the ball abuts the pad portion, until the pressing pressure reaches a predetermined value; and applying the ultrasonic vibration when the pressing pressure reaches the predetermined value.

15. The bump bonding method according to claim 13, further comprising:

driving the bonding arm with a drive device.

16. The bump bonding method according to claim 13, further comprising:

driving the bonding arm with a drive device attaching the ultrasonic head to the bonding arm with a blade spring.

* * * * *